(12) United States Patent
Gogh et al.

(10) Patent No.: US 6,620,296 B2
(45) Date of Patent: Sep. 16, 2003

(54) TARGET SIDEWALL DESIGN TO REDUCE PARTICLE GENERATION DURING MAGNETRON SPUTTERING

(75) Inventors: James Van Gogh, Sunnyvale, CA (US); Jim Thompson, Palo Alto, CA (US); Marc Schweitzer, San Jose, CA (US); Yoichiro Tanaka, Sunnyvale, CA (US); Alan Liu, Mountain View, CA (US); Anthony CT Chan, Los Altos Hills, CA (US); Karl Brown, Mountain View, CA (US); John C. Forster, San Francisco, CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 09/905,263

(22) Filed: Jul. 13, 2001

(65) Prior Publication Data

US 2002/0121436 A1 Sep. 5, 2002

Related U.S. Application Data

(60) Provisional application No. 60/218,953, filed on Jul. 17, 2000.

(51) Int. Cl.[7] .............................................. C23C 14/34
(52) U.S. Cl. ........................ 204/192.1; 204/192.12; 204/298.12; 204/298.13
(58) Field of Search .................... 204/192.1, 192.12, 204/298.12, 298.13

(56) References Cited

U.S. PATENT DOCUMENTS

| 5,658,442 A | 8/1997 | Van Gogh et al. |
| 6,001,227 A | 12/1999 | Pavate et al. |
| 6,059,945 A | 5/2000 | Fu et al. |
| 6,149,776 A | 11/2000 | Tang et al. |

FOREIGN PATENT DOCUMENTS

| DE | 44 36 176 A | 4/1995 |
| EP | 0 311 697 A | 4/1989 |
| EP | 0 794 554 A | 2/1997 |
| JP | 60-204878 | * 10/1985 |
| JP | 07 102367 | 4/1995 |

* cited by examiner

Primary Examiner—Rodney G. McDonald
(74) Attorney, Agent, or Firm—Townsend and Townsend and Crew

(57) ABSTRACT

An apparatus for a physical vapor deposition system includes a target having a sidewall having an undercut thereon defining a net erosion area and a net redeposition area.

21 Claims, 11 Drawing Sheets

US 6,620,296 B2

TARGET SIDEWALL DESIGN TO REDUCE PARTICLE GENERATION DURING MAGNETRON SPUTTERING

CROSS-REFERENCES TO RELATED APPLICATIONS

The present application is related to and claims priority from U.S. Provisional Patent Application No. 60/218,953, filed on Jul. 17, 2000, which is incorporated herein by reference for all purposes.

BACKGROUND OF THE INVENTION

Physical vapor deposition (PVD), also referred to as sputtering, uses a solid metal, such as titanium, as the source or target to deposit material on a substrate. During a PVD process, metal atoms are produced by dislodging them from the target with high energy ion bombardment. The high energy ions that cause sputtering are typically from a heavy inert gas, such as argon. The substrate is provided on a pedestal at a selected distance from the target and held at a negative potential with respect to the plasma generated by a power source. A major portion of the sputtered metal atoms or groups of atoms follow a substantially linear trajectory over a distribution of angles due to the low pressure maintained in the chamber. The gas composition and pressure in the sputtering chamber is typically achieved by evacuating the chamber down to about $10^{-9}$ Torr before back-filling the chamber with argon to a pressure of a few millitorr. At these gas pressures, the pedestal can be raised upward within the chamber so that the distance between the target and the substrate can be less than the mean free path of the argon gas molecules. Therefore, many sputtered particles travel directly to the substrate without a collision.

However, a significant portion of the sputtered particles become scattered in the gas, due to collisions with the gas, electrical field effects and the like. These scattered particles can redeposit onto various surfaces of the chamber, e.g., onto the sidewall of the target itself. The material redeposited onto the sidewall of the target accumulates over time to form particles or sheets of the material. Direct current (DC) power is applied to the target during sputter deposition on a substrate and then removed from the target between substrates. Therefore, the target, as well as the redeposited material, is continually being heated and cooled, thereby subjecting itself to thermal stress. Over a period of time, this stress may cause particles of the material deposited on the target sidewall to come loose and fall onto the substrate. The material which adheres to the sidewall with low adhesion strength is more prone to come loose and degrade the particle performance of the chamber. The adhesion strength of the deposited material depends on the angle of incidence of the sputtered material as it collides into the sidewall. Generally, closer the angle of incidence is to the right angle, greater the collision force, and thus the greater the adhesion strength between the deposited material and the target sidewall.

SUMMARY OF THE INVENTION

The present invention provides a sputter target for a physical vapor deposition system that reduce particles generated during sputtering. According to one embodiment of the present invention, an apparatus for a physical vapor deposition system includes a target having a sidewall having an undercut thereon defining a net erosion area and a net redeposition area.

In another embodiment, a target for a physical vapor deposition system includes a lower surface, and a sidewall defined around the lower surface. The sidewall includes an undercut defining a net erosion area and a net redeposition area. Yet in another embodiment, a method for manufacturing a target includes determining a transition point on a sidewall of a first target. The transition point defining a net erosion area and a net redeposition area. An undercut is provided on a sidewall of a second target according to the transition point determined.

DETAILED DESCRIPTION OF A PREFERRED EMBODIMENT

Figure 1:
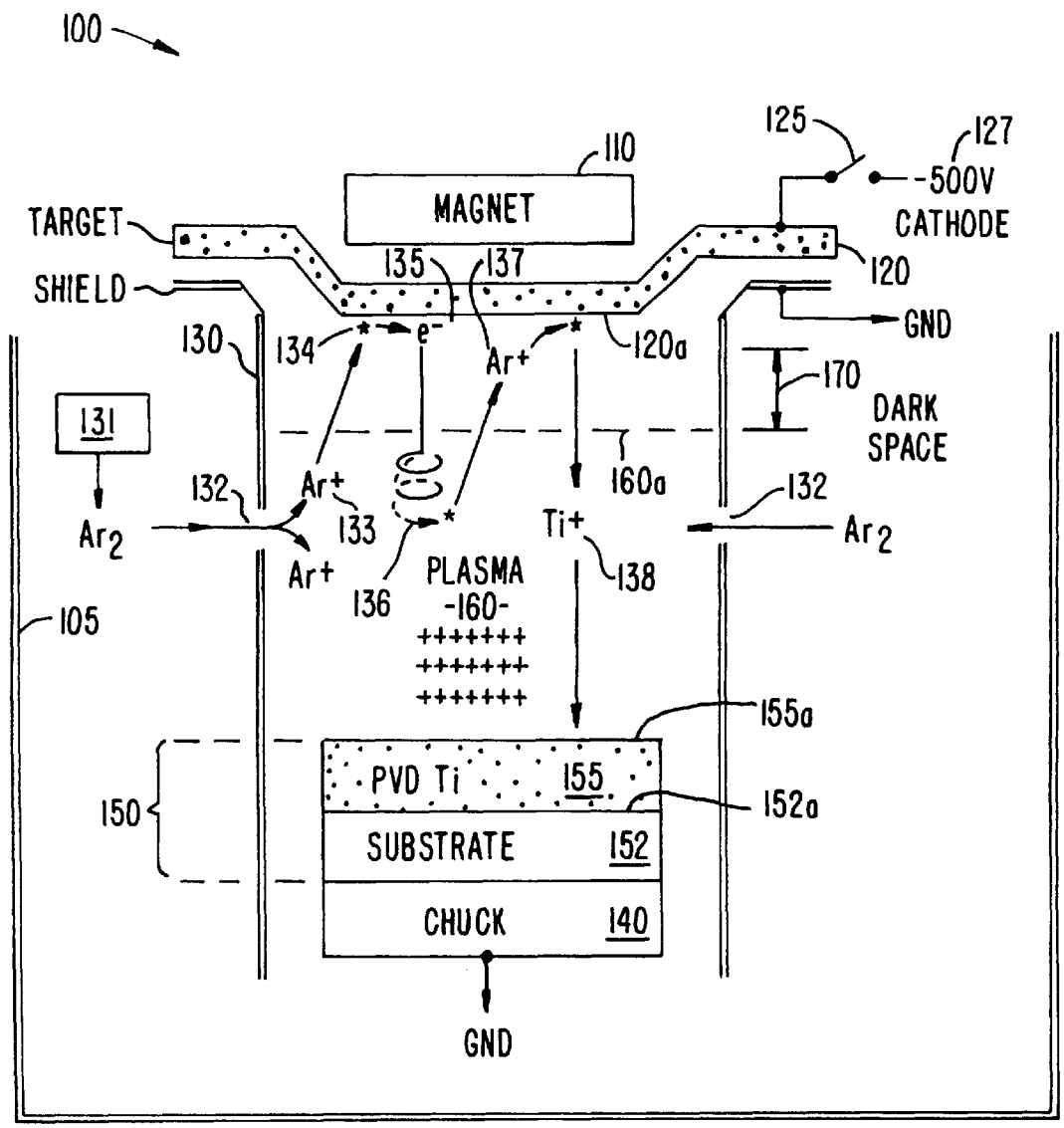
FIG. 1 is a simplified cross-sectional view of a sputtering chamber according to one embodiment of the present invention.

FIG. 1 shows a schematic diagram of a DC sputtering magnetron system 100. A magnet 110 is positioned over a portion of target 120. The target includes a deposition-producing portion that is electrically conductive and is composed of the to-be-sputtered material (e.g., a metal such as titanium). The target 120 is typically of a symmetrical form such as a circular disk but may have other features. The target 120 is typically structured for removable insertion into the corresponding DC magnetron PVD system 100. Targets are periodically replaced with new targets given that the PVD process erodes away the to-be-deposited material of each target.

A switching means 125 may be provided for selectively connecting the target 120 to a relatively negative voltage source 127. In general, the negative voltage source 127 provides a DC cathode voltage in the range of about −350 V to −530V, preferably about −470 V to −530 V, relative to the potential on an opposed anode (ground or GND in the illustrated example). The specific cathode voltage varies according to design. When switching means 125 is closed to connect the target 120 with the negative voltage source 127, the target can act as a source of negatively charged particles such as 135($e^-$). Consequently, the target may also be referred to as the cathode.

A tubular gas-containment shield 130, usually of cylindrical shape, is provided below and spaced apart from the target 120. The shield 130 is electrically conductive and is generally coupled to ground (GND) or to another relatively positive reference voltage so as to define an electrical field between the target 120 and the shield. The shield 130 has a plurality of apertures 132 defined therethrough for admitting a supplied flow of gas 131 such as argon (Ar) from the exterior of the shield 130 into its interior.

A workpiece-supporting chuck 140 is provided centrally below and spaced apart from the target 120, usually within the interior of the shield 130. The chuck 140 is electrically conductive and is generally also coupled to ground (GND) or to another relatively positive reference voltage so as to define a further electrical field between the target 120 and the chuck.

A replaceable workpiece 150 such as a semiconductor wafer is supported on the chuck centrally below the target 120. The workpiece 150 originally consists of a substrate 152 having an exposed top surface 152a. As PVD sputtering proceeds, a metal film 155 having a top surface 155a builds up on the substrate 152. It is desirable that the deposition of the metal film 155 be uniform across the entire top surface 152a of the substrate.

The workpiece substrate 152 may include an insulative layer, e.g., $SiO_2$. In such cases, the metal film 155 may be electrically insulated from chuck 140 and the voltage of the metal film 155 will float to a slightly negative level relative to the chuck's voltage (e.g., GND).

DC magnetron operation initiates as follows. When the switching means 125 is closed, initial electric fields are produced between the target 120 and the shield 130 and the chuck 140. Plasma igniting gas is introduced. The illustrated assembly of FIG. 1 is usually housed in a low pressure chamber 105 (partially shown). Some of the supplied gas 131 that enters the interior of the shield 130 is ionized, providing positively charged ions ($Ar^+$) 133 and electrons, when subjected to the initial electric fields.

Due to electrostatic attraction, one of the ions 133 accelerates towards and collides with the bottom surface of the target at a first collision point 134. The point of collision is denoted with an asterisk ("*"). This initial collision induces emission of an electron 135 from the cathode 120. A particle of target material (Ti) may also be dislodged by the collision. The emitted electron 135 drifts down towards the more positive chuck 140. However, the magnetic fields of the magnet 110 give the electron 135 a spiraling trajectory 136. Eventually the electron 135 collides with a molecule of the inflowing gas 131, generally a noble gas such as Ar. This second collision (*) produces another positively charged ion 137 ($Ar^+$) which accelerates towards and collides with the bottom surface of the target. This third collision emits yet another electron, and a chain reaction is established leading to the creation of a sustained plasma 160 within the interior of the gas-containment shield 130. The plasma 160 is charged positive relative to the cathode 120 and begins to act like a floating anode. This changes the electric field distribution within the DC magnetron PVD system 100. At some point the electric field distribution stabilizes into a long term steady state.

The ballistic collisions of massive particles, such as positively charged ions 137, with the bottom surface of the target 120 sometimes cause small particles of the target's material to break off and move toward the underlying workpiece 150. An example of such an emitted target particle is shown as a Ti 138. The sizes and directions of the emitted target particles tend to produce a relatively uniform deposition of the emitted material (e.g., titanium) on the top surface of the workpiece 150.

Figure 2:
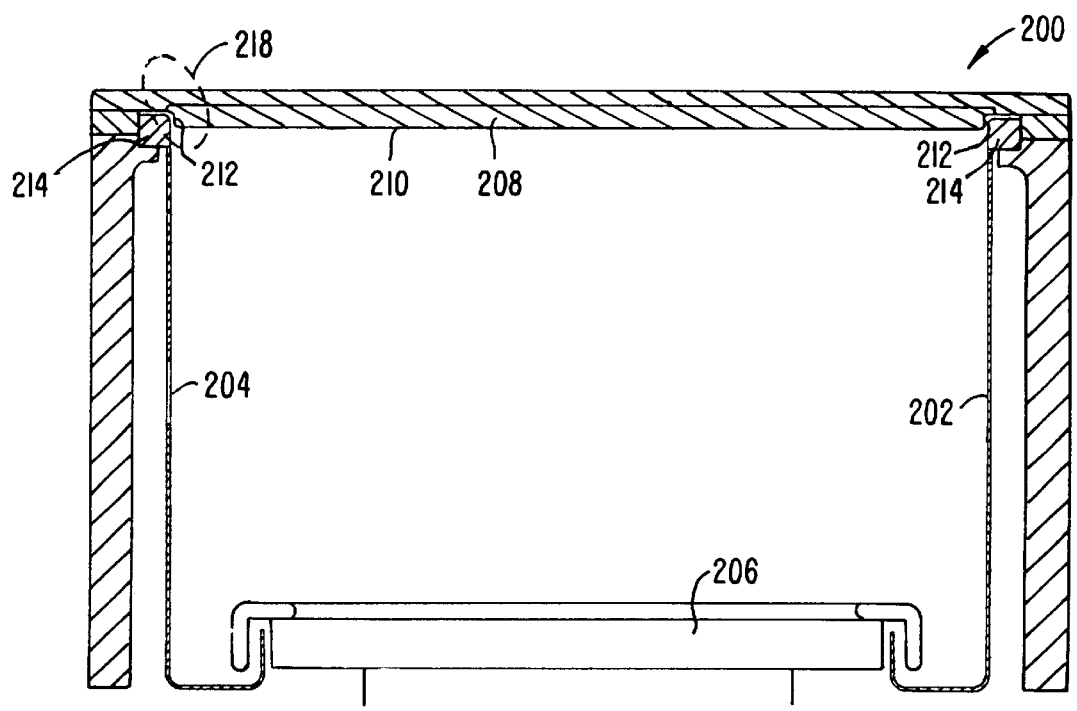
FIG. 2 is a simplified cross-sectional view of a sputtering chamber including a sputtering target according to one embodiment of the present invention.

FIG. 2 shows a simplified sectional view of a sputtering chamber 200, which provides a more accurate view of the relative dimensions of various components of a sputtering chamber described below in connection with embodiments of the present invention. The chamber 200 generally includes a chamber enclosure 202 having at least one gas inlet 204. A substrate-support pedestal or workpiece-supporting chuck 206 is disposed at the lower part of the chamber 200, and a target 208 is received at the upper part of the chamber 200. The target 208 includes a lower surface 210 and sidewalls 212 at the periphery of the target. The enclosure 202 is preferably grounded, so that a negative voltage may be maintained on the target 208 with respect to the grounded enclosure 202. A dark space shield 214 is provided adjacent the sidewalls 212 at a sufficiently close proximity to prevent plasma from forming therebetween.

Figure 3A:
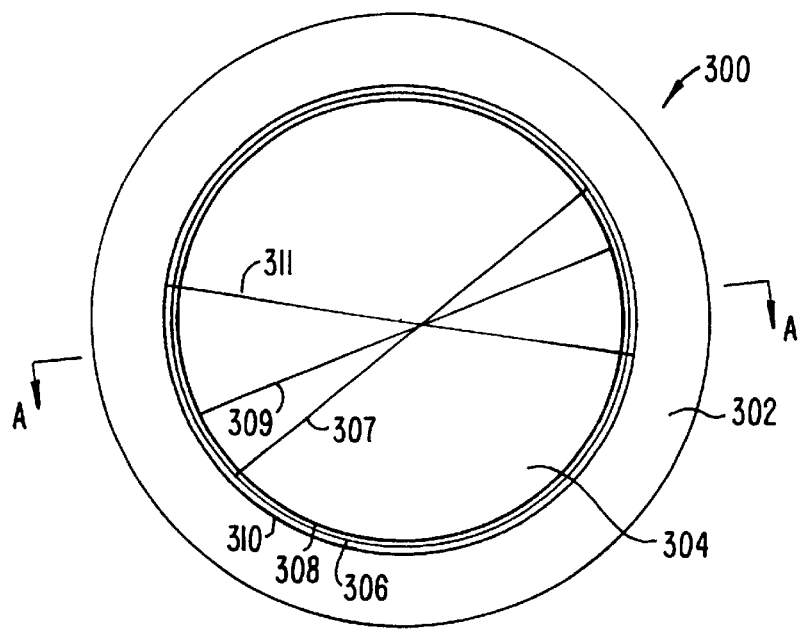
FIG. 3A is a schematic bottom plan view of a sputtering target according to one embodiment of the present invention.

FIG. 3A depicts a bottom plan view of a target assembly 300 that can be used in the chamber 200. The target assembly has a backing plate 302 and a target 304 affixed to the backing plate. The backing plate, in turn, is affixed, e.g., screwed on, to the walls of the chamber to properly position the target within the sputtering chamber 200. In another embodiment, the target assembly is a single piece, wherein the target and the blacking plate are made of the same material. However, in present embodiment, the backing plate is made of a copper alloy, such as CuCr or CuZn, and the target is made of titanium. The target may be aluminum, tantalum, copper, or other sputtering materials in other embodiments. The target has a lower circular edge 306 which defines a first diameter 307, a middle circular edge 308 which defines a second diameter 309 that is slightly smaller than the first diameter, and an upper circular edge 310 that defines a third diameter 311 that extends beyond the first diameter. In one embodiment, the first diameter, second diameter, and third diameter are about 12.554 inches, about 12.524 inches, and 12.75 inches, respectively. Therefore, the target has on its sidewall a protrusion or lip defined by the lower and middle circular edges, as will be explained in greater detail later.

Figure 3B:
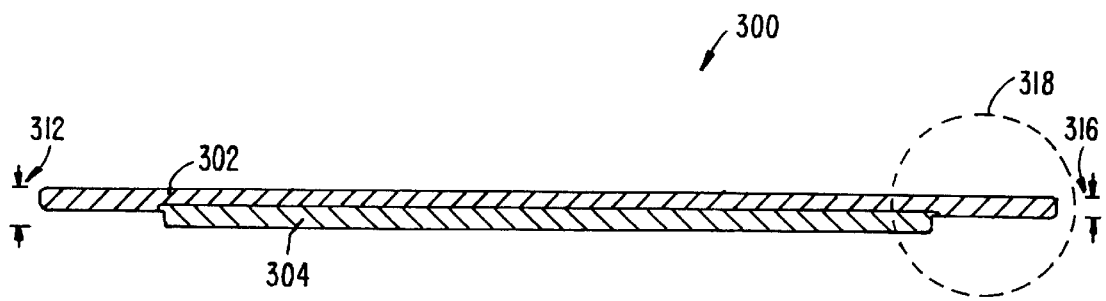
FIG. 3B is a schematic cross-sectional view of the sputtering target of FIG. 3A taken along a line A—A.

FIG. 3B depicts a cross-sectional view of the target assembly 300 taken along a line A—A in FIG. 3A. The target assembly has a thickness 312 of about 0.600 inch. The backing plate 302 has a diameter 314 of about 16.58 inches and a thickness 314 of about 0.33 inch. In other embodiments, the above dimensions may vary.

Figure 3D:
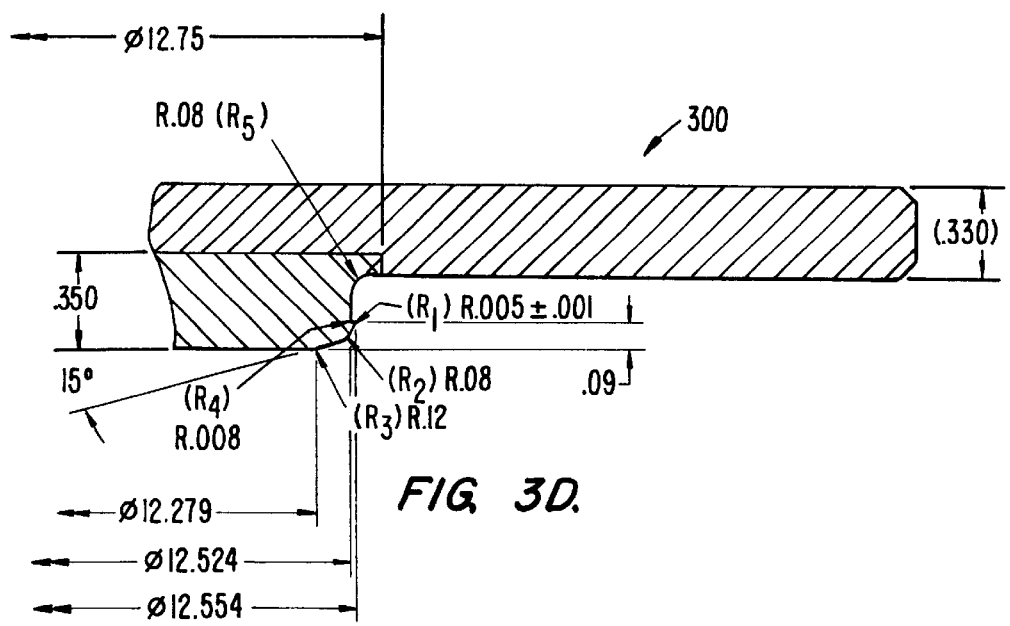
FIG. 3D shows some of the dimensions of the sputtering target of the FIGS. 3A and 3B, according to one embodiment of the present invention.
Figure 3C:
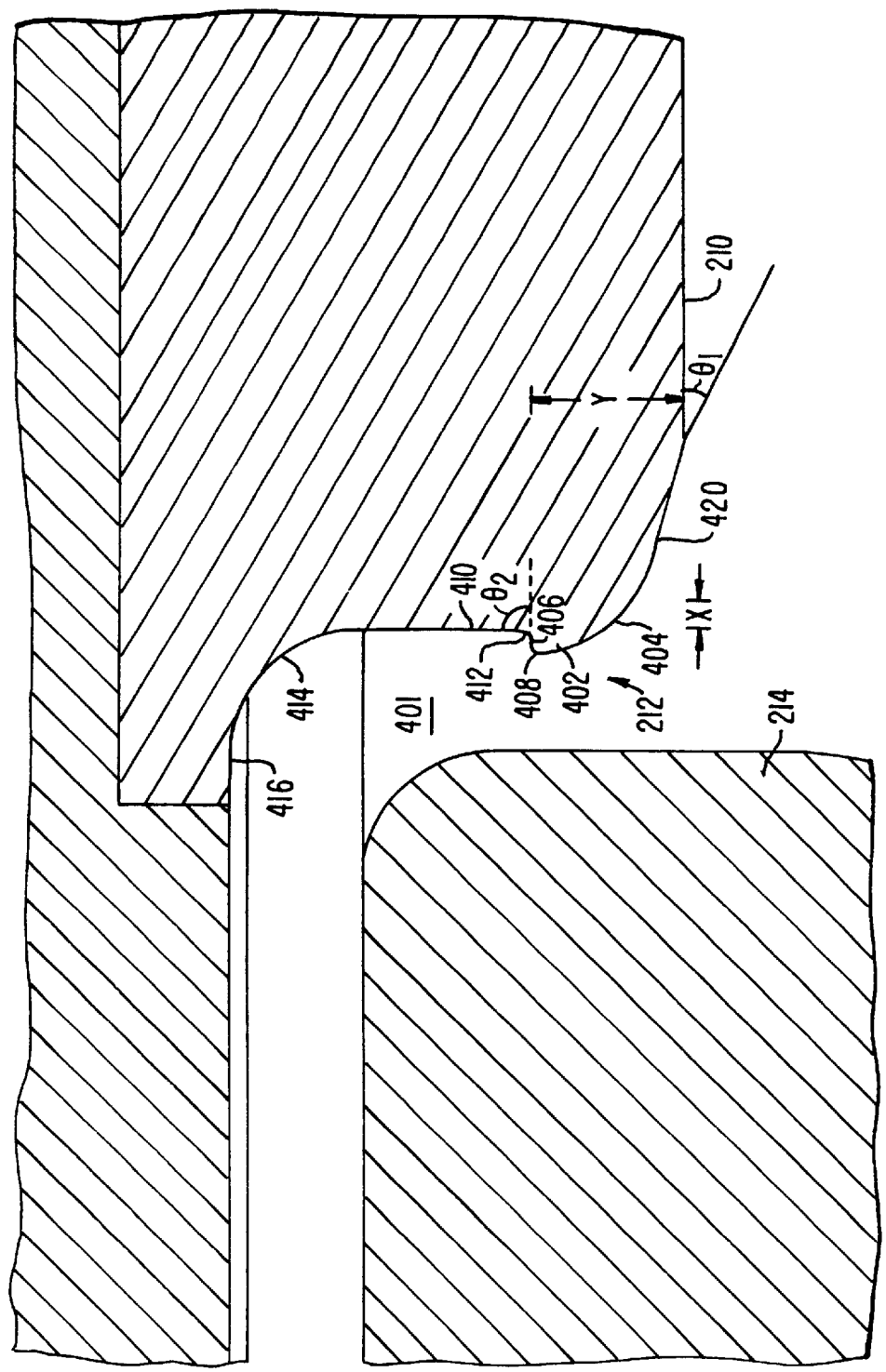
FIG. 3C shows an enlarged, cross-sectional view of a sidewall area of the sputtering target of FIGS. 3A and 3B.

FIG. 3C depicts an enlarged view of an area 218 of FIG. 2 which corresponds to an area 318 of FIG. 3B. The area shows the target sidewall 212, the dark space shield 214, and a space 401 therebetween. The sidewall includes a lip 402 defined by an undercut made on the target sidewall. The lip includes a sloping, lower edge 404 and a horizontal, upper edge 406 separated from each other by a curving tip 408. In one embodiment, a radius of curvature ($R_1$) of the curving tip 408 is no greater than about 0.05 inch, preferably about 0.005 inch. Generally, the tip 408 should have a small radius of curvature to better delineate the sloping edge 404 and the horizontal edge 406. However, the radius of curvature should be large enough to prevent arcing from occurring at the tip 408. A radius of curvature ($R_2$) of the sloping lower edge 404 is no greater than about 0.5 inch, preferably about 0.08 inch. The sloping, lower edge 404 is connected to a transitional edge 420 that is connected to the lower surface 210 of the target. A radius of curvature ($R_3$) of the transitional edge is no greater than about 1 inch, preferably about 0.12 inch. The transitional edge 420 and the lower surface 210 form an angle $\theta_1$ that is between about 0–90 degrees, preferably about 5–35 degrees, more preferably about 15 degrees. In another embodiment, the sloping, lower edge 404 is connected directed to the lower surface 210 without the transitional edge provided therebetween.

Figure 7:
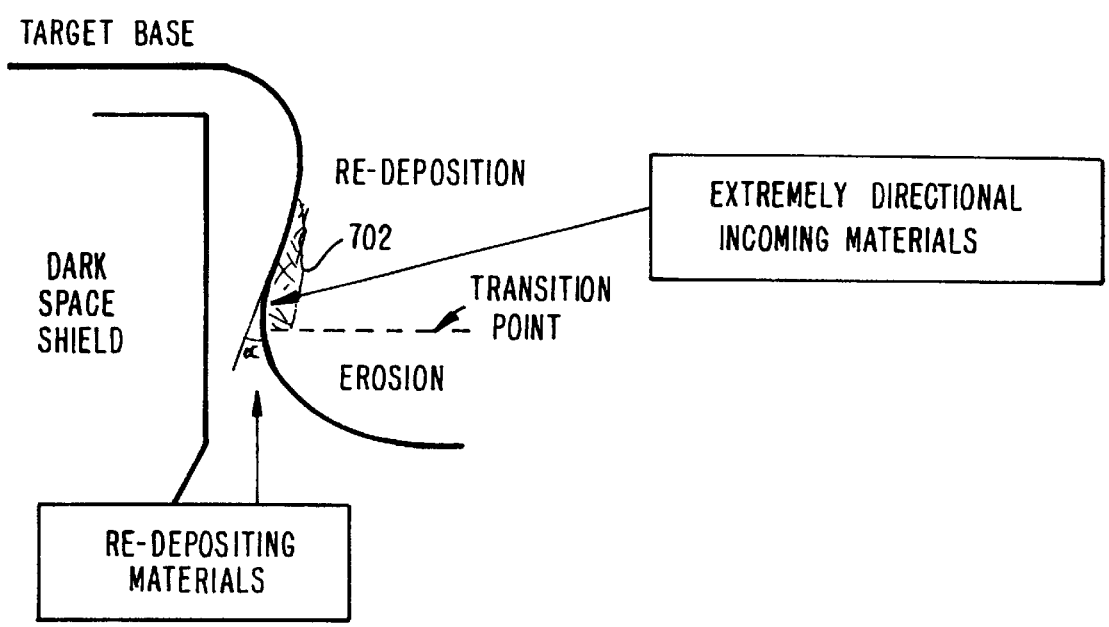
FIG. 7 is a simplified cross-sectional view of a conventional target sidewall.

In one embodiment, the target sidewall further includes a vertical edge 410, a lower curvature 412, an upper curvature 414, and an outer extension 416. The vertical edge is provided above the upper edge 406 of the lip. The vertical edge preferably has an angle $\theta_2$ which is about 45 degrees or greater, preferably about 80 degrees or greater, in order to provide better adhesion for materials redepositing thereon. The incoming materials colliding onto the target sidewall generally adhere better (i.e., less likely to come loose and fall off) and reduce particle control problem if the angles of incidence of the collisions are closer to the right angle. FIG. 7 shows a simplified cross-sectional view of a conventional target sidewall having a region 702. The incoming materials generally collide onto the region 702 at the angles of incidence a that are substantially less than the right angle. Therefore, the materials do not firmly adhere to the region and are likely to fall off to onto a substrate being processed below.

Referring back to FIG. 3C, in this specific embodiment, the vertical edge forms a right angle to the horizontal edge 406 (and to the lower surface 210 of the target). The lower curvature 412 has a radius ($R_4$) of about 0.008 inch, but may be up to 0.25 inch in other embodiments. The upper curvature 414 has a radius ($R_5$) of about 0.08 inch, but may be up to 0.5 inch in other embodiments.

In one embodiment, a vertical extension Y of the lip is between about 0.05 to 0.3 inch, preferably about 0.094 inch, where the vertical extension is a vertical distance from the lower surface 210 of the target to the curving tip 408. Alternatively, the vertical extension Y may be up to greater than 0.3 inch. The horizontal extension X of the lip 402 is between about 0.01 to 0.2 inch, preferably about 0.015 inch, where the horizontal extension is a horizontal distance from the vertical edge 410 to the curving tip 408. In another embodiment, the horizontal distance is between about 0.01 to 0.05 inch. The horizontal extension of the lip reduces redeposition on the vertical edge by shielding parts of the vertical edge. Therefore, a longer horizontal extension generally provides a better shielding function. In other embodiments, the horizontal distance X may be between 0.005 inch to a length not greater than the dark space length. The dark space length is generally considered to be about 0.6 inch within the sputtering chamber, as explained in more detail later. If the horizontal distance X exceeds the dark space length, plasma may ignite within the space 401 which is obviously undesirable. To prevent such occurrences, the sputtering chambers are configured so that the distance between the dark space shield and the target is less than the dark space length.

The dark space is the boundary between a plasma and a solid surface and is related to the Debye length. The Debye length is a characteristic length inside the plasma over which a potential drop occurs. It is given mathematically (in MKS units) as:

$$\lambda_D = \left(\frac{\varepsilon_0 k T_e}{ne^2}\right)^{1/2},$$

where $\varepsilon_0$ is the permitivity of free space, k is Boltzmann's constant, $T_e$ is the electron temperature, n is the plasma density, and e is the charge of an electron. The dark space depends on the Debye length, as well as the voltage between the plasma and the solid surface. Although the Debye length is precisely defined, the extent of the dark space is not so precisely defined because it depends on the collision length between electrons and neutrals. An estimate for the dark space length or distance at low (<10 mTorr) pressures is $$s_0 = \frac{2}{3} \cdot \lambda_D \cdot \left(\frac{eV}{kT_e}\right)^{3/4},$$

where V is the voltage between the plasma and the solid surface. The actual numerical factor (=⅔ here) will depend on the assumptions used in the derivation.

For example, if the plasma density is $1\times10^{11} \text{cm}^{-3}$, the electron temperature is 5 eV, and the voltage is 500V, then the Debye length is $\lambda_D = 5\times10^{-3}$ cm, and the dark space length is $s_0 = 0.11$ cm = 0.044 inch. This length is comparable to the 0.06 inch typically used for PVD applications. The plasma density tends to be lower near the edge of the target so the dark space length tends to be longer in the PVD applications.

Figure 4A:
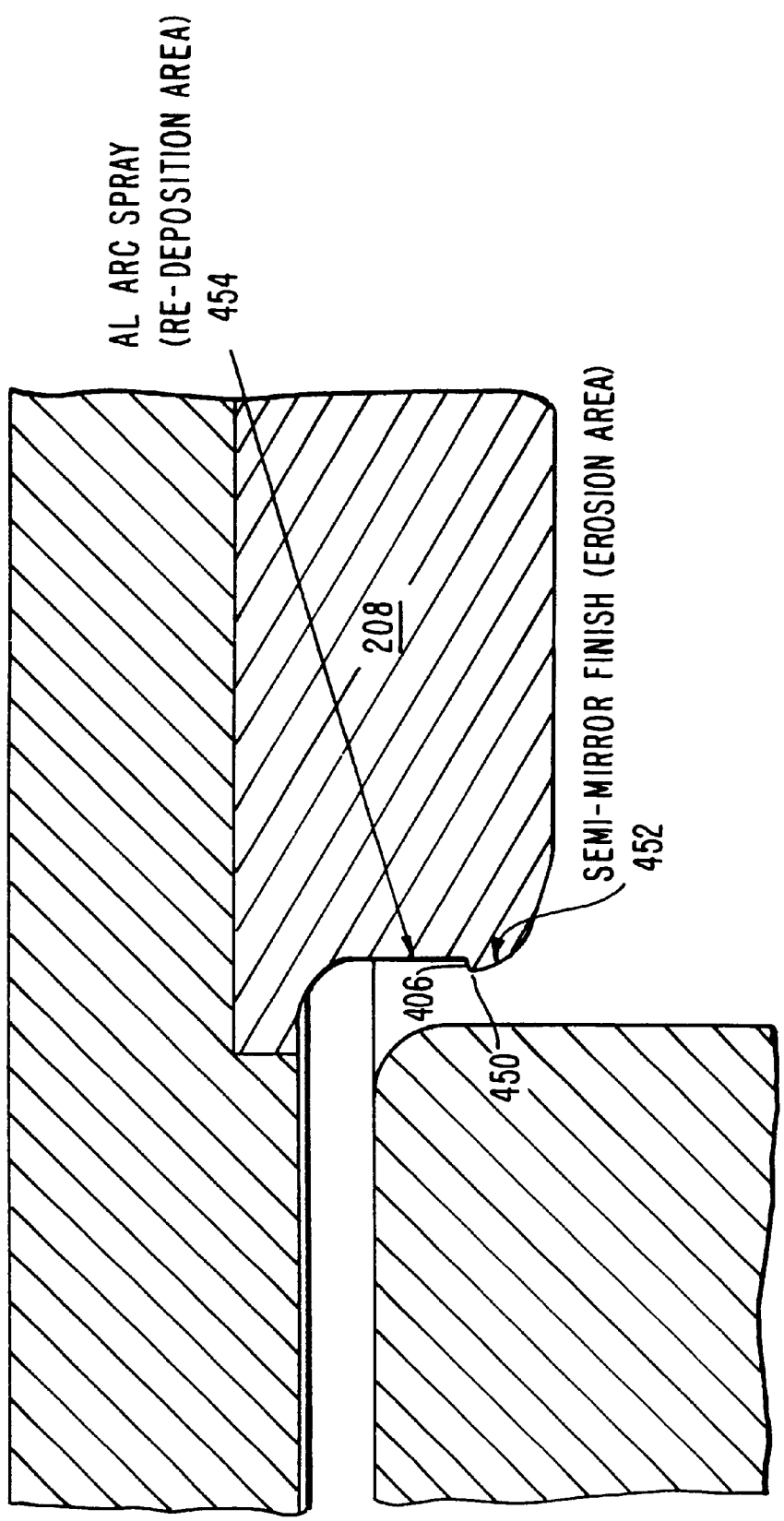
FIG. 4A depicts an enlarged, cross-sectional view of a sidewall area of the sputtering target of FIGS. 3A and 3B, showing the location of a net redeposition area and a net erosion area on the target.
Figure 4B:
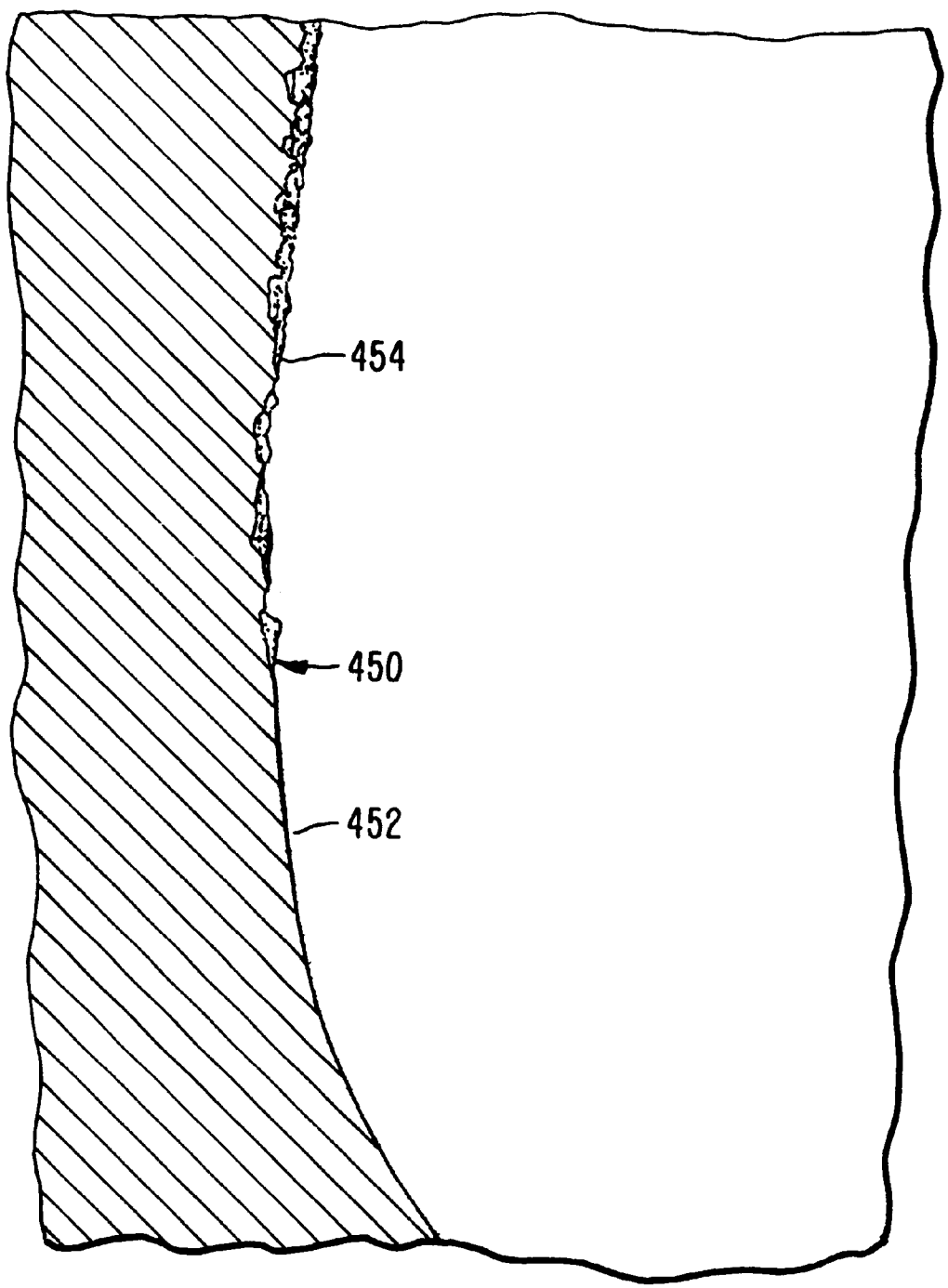
FIG. 4B depicts an enlarged, cross-sectional view of a sidewall of a conventional target, showing the location of a net redeposition area and a net erosion area on the target.

Referring to FIG. 4A, the upper edge 406 or the upper extension of the lip is provided at or near a transition point 450 between a net erosion area 452 and a net redeposition area 454. The net erosion area is an area of the target 208 where there is more erosion than deposition, whereas the net redeposition is an area of the target 208 where is there is more deposition than erosion. The transition point is the point where the net erosion area and the net redeposition area meet. FIG. 4B shows a location of the transition point on a conventional target. The location of the transition point is affected by various process parameters, such as, the target dimensions, process parameters (e.g., the bias power applied), the dimensions of chamber, and the like. Since the plasma formation and electrical field within the chamber are not perfectly uniform, the transition points vary along the target sidewalls. The inventors have determined that the transition points around the target sidewall may vary as much as up to 0.1 inch for a particular Ti/TiN PVD process performed in a SIP TTN™ chamber, manufactured by Applied Materials that is configured to process eight inch wafers.

The transition points around the target are generally determined experimentally. In one embodiment, a test target, such as the one shown in FIG. 4B, is inserted in a sputtering chamber and the PVD process is performed for an extended period under replicated actual process conditions. The test target preferably has smooth sidewall surfaces, so that the contours of the target sidewall would not affect the location of the transition point. In some embodiments, initially, the chamber pressure, DC power applied to the target, and the like, are adjusted or optimized to locate the transition point at the sidewall of the target. Generally, increasing chamber pressure and lowering DC power lowers the location of the transition point. For example, if the chamber pressure is increased too much, e.g., 4 mTorr or above, the transition point may be at the lower surface 210 of the target rather than at the sidewall 212.

After the process parameters have been optimized, one or more wafers are processed within the chamber. Once redeposited materials on the sidewalls reach a few micron in thickness, the test target is removed from the chamber. In one Ti sputtering embodiment, the sputtering process needs to be run for about 20 kilowatt hours to have sufficient amount of materials redeposited on the sidewall. The test target is removed from the chamber to determine the location of the transition points around the target sidewall. In one embodiment, a portion of the target is cut off, and then the cross-section is examined under a microscope to determine the distance of a transition point from the lower or upper surface of the target. Thereafter, an undercut is made around the sidewall of another target according to the transition point experimentally determined to form the lip 402. The undercut or horizontal, upper edge 406 is provided at or within 0.1 inch of the transition point. Subsequently, additional targets may be manufactured using the transition points previously determined.

In another embodiment, two or more portions of the test target are cut off to determine the transitional points at various points around the target sidewall since the transitional points may vary along the target sidewall. An undercut is made around another target mirroring the varying transitional points around its sidewall. Alternatively, an undercut of uniform height from the lower surface 210 may be made around the target sidewall at about a transition point with the minimum vertical distance from the lower surface 210 of the target, so that all areas below the undercut are net erosion areas.

The lip 402 is capable of artificially setting the transition point to some extent as long as it is not provided above the actual transition point. Because of this capability of the lip 402, an undercut may be made at slightly below the actual transition point. In this way, only one transition point may need to be determined since the possibility of having lower transitional points around other parts of the target sidewall may be compensated by providing the undercut slightly below that transition point. In addition, the undercut may be provided slightly below the lowest transition point to compensate for slight changes in process conditions that may alter the transition points. For these purposes, in one embodiment, the undercut is made within about 0.1 inch below the transition point. In another embodiment, the undercut is made within 0.002 inch or 0.005 inch below the transition point.

Yet in other embodiments, a plurality of process conditions are used to obtain an optimal location for the undercut. That is, a plurality of test targets are inserted into the chamber to be processed at slightly different process conditions. The transition points for each of these test targets are determined, and then an optimal undercut location is selected.

Referring back to FIG. 4A, the lip 402 resulting from the undercut provides a clear delineation between the net erosion area and the net redeposition area. That is, the areas above the upper edge 406 define the net redeposition area, and the areas below that (,i.e., the sloping edge 404, transition edge 420 and lower surface 210) define the net erosion area. This clear delineation simplifies the texturization of the net redeposition area. Without this clear delineation between the net erosion and redeposition areas, it is difficult to properly texturize only the net redeposition area since the transition points vary around the target. Generally, the net redeposition area is texturized to provide the net redeposition area with uneven surfaces in order to reduce stress exerted on the materials redeposited thereon. In one embodiment, A1 arc spray is used to texturize the net redeposition area.

In addition, the abrupt protrusion of the lip improves the process performance repeatability. The location of transition point deviates slightly depending on the relative alignments of various components, e.g., the magnet, target, and dark space shield, of the sputtering chamber. These components may need to be replaced or worked on periodically. As a results, one or more of them may be misaligned or differently aligned which may produce slightly different process condition, resulting in different transition points, which in turn may cause repeatability problem. The lip with an undercut may artificially define the transition point to some extent. The inventors have discovered that the undercut of the lip 402 can effectively define the transition point even though the upper edge 406 is provided at about 0.01 inch away from the actual transition point. Consequently, the target with the lip 402 may maintain the same transition points even if the process conditions are slightly altered due to misalignment or realignment. This consistency in the location of the transition points improves process performance repeatability.

FIG. 3D provides preferred dimensions of some of the components of the target assembly 300 discussed above, according to one embodiment of the present invention. The dimensions are in inches and "R" stands for the radius of curvature. For example, "R.08" indicated for the upper curvature means that its radius of curvature is 0.08 inch.

Figure 5A:
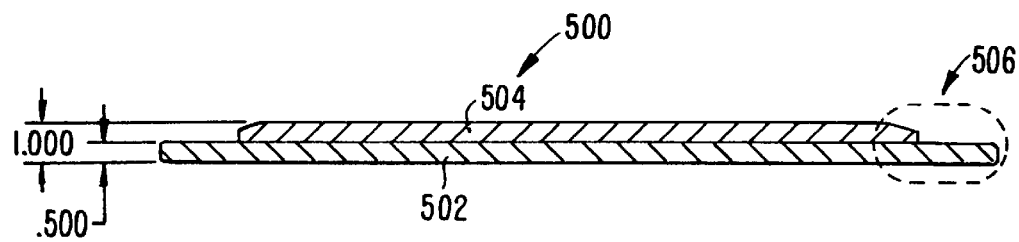
FIG. 5A is a schematic cross-sectional view of a sputtering target according to another embodiment of the present invention.
Figure 5B:
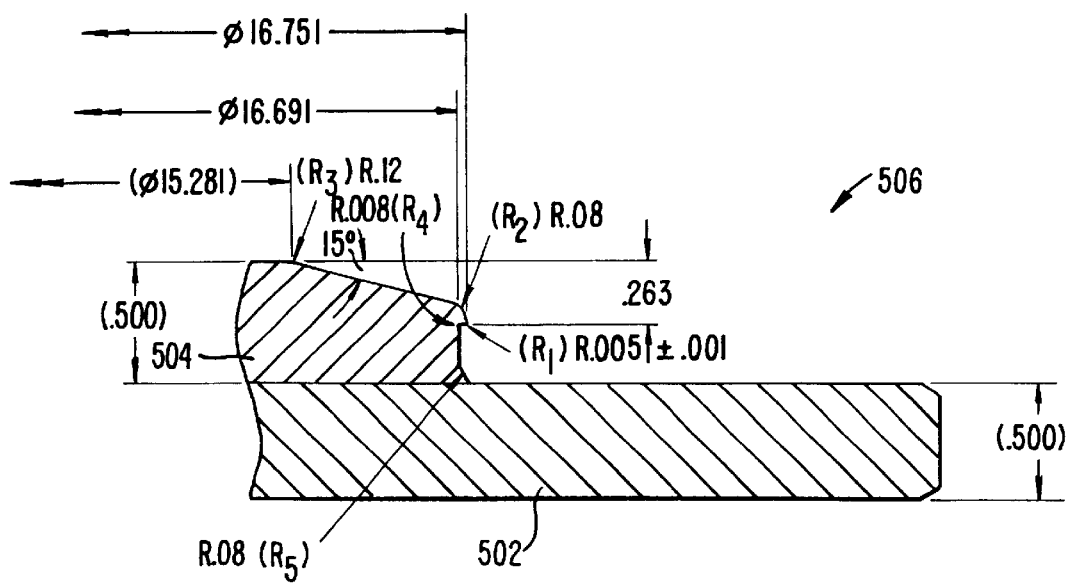
FIG. 5B depicts an enlarged view of a sidewall area of the sputtering target of FIG. 5A.

The dimensions provided above are specific for a target designed for use in an SIP TTN™ chamber configured for eight inch wafers, which is manufactured by Applied Materials of Santa Clara, Calif. Therefore, the targets for other types of PVD chambers or for other types of PVD processes may have different dimensions than those provided above. A person of ordinary skill in the art will recognize that these values are in part chamber specific and may vary if chamber of other design and/or volume are employed. For example, the dimensions of a target designed for use in an SIP TTN chamber configured for twelve inch wafers, manufactured by Applied Materials, are provided in FIGS. 5A and 5B. FIG. 5A shows a target assembly 500 including a backing plate 502 and a target 504 affixed to the backing plate, and an area 506 around the target sidewall. FIG. 5B shows an enlarged view of the area 506. The dimensions in the figures are provided in inches and "R" refers to the radius of curvature, as in FIG. 3D.

Figure 6A:
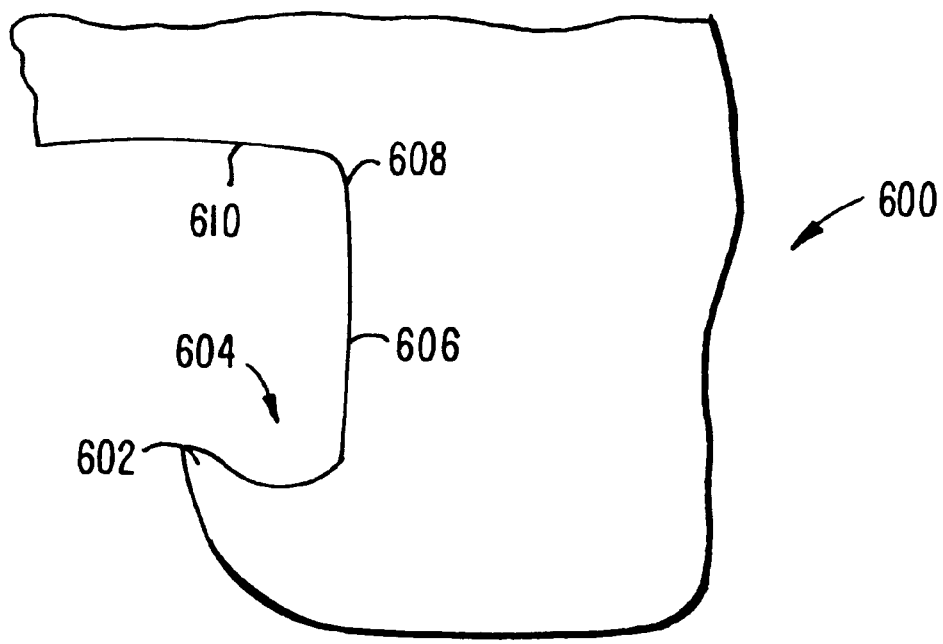
FIGS. 6A–6D are simplified cross-sectional views of target sidewalls according to alternative embodiments of the present invention.
Figure 6B:
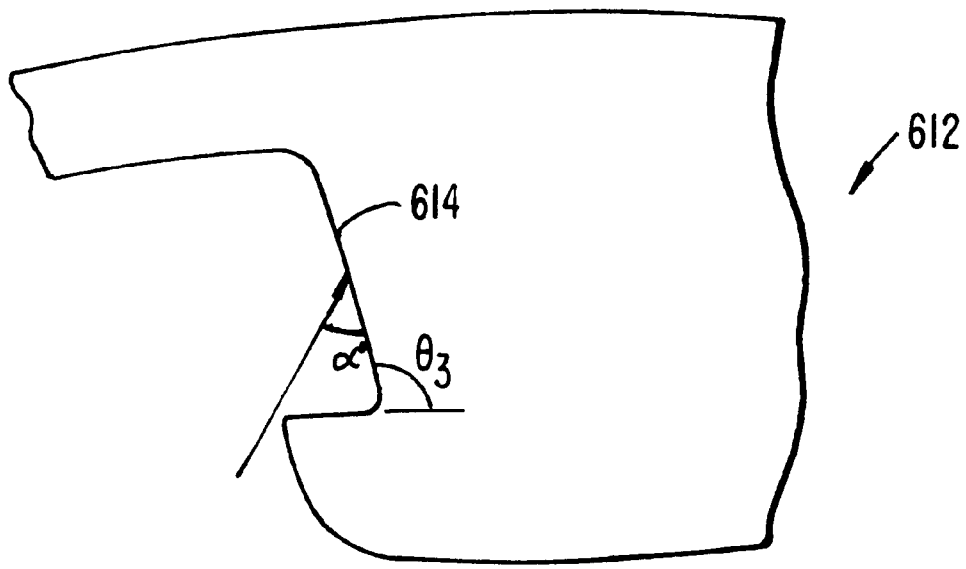
Figure 6C:
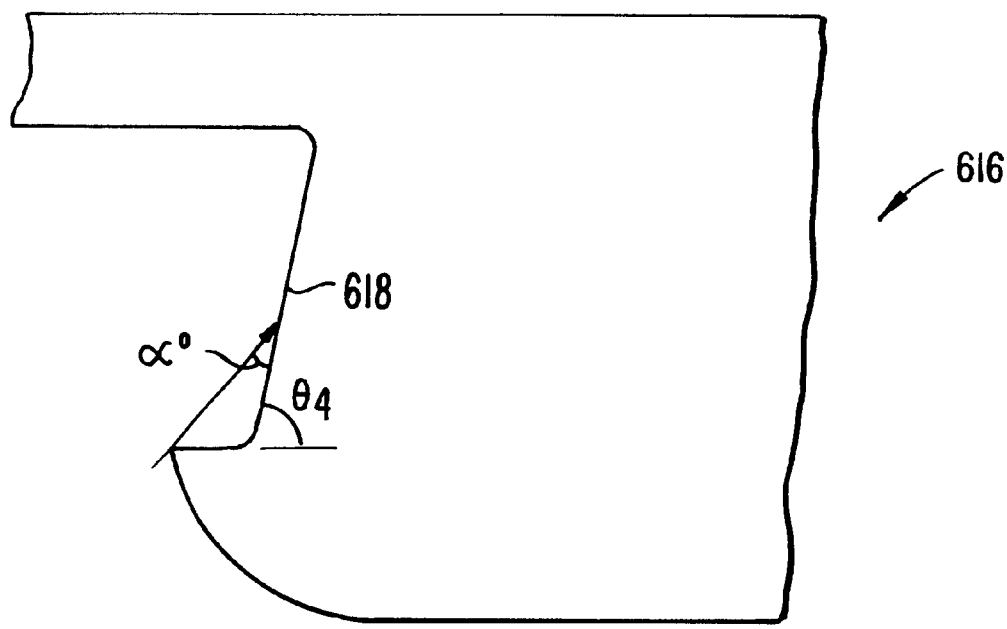
Figure 6D:
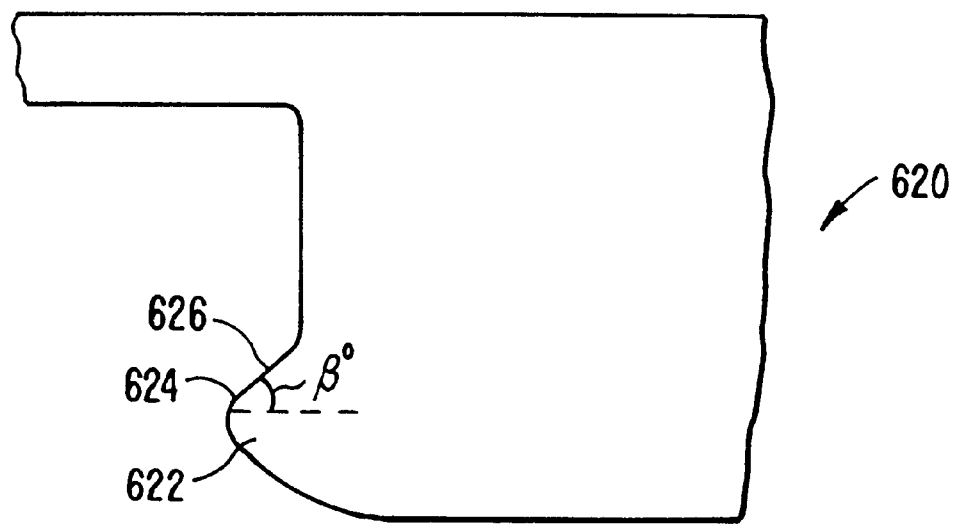

FIGS. 6A–6D show schematic views of target sidewalls that may be implemented on targets according to alternative embodiments of the present invention. Referring to FIG. 6A, a target sidewall 600 includes a lip 602, a groove 604, a vertical edge 606, an upper curvature 608, and an outer extension 610. The groove is configured to collect fallen particles from the vertical edge, the upper curvature, and the outer extension. Referring to FIG. 6B, a vertical edge 614 of a target sidewall 612 has an angle $\theta_3$ greater than 90 degrees to generally provide the incoming materials with higher angles ($\alpha$) of incidence to allow the redeposited materials to adhere more firmly onto the sidewall. Referring to FIG. 6C, a vertical edge 618 has an angle $\theta_4$ less than 90 degrees but greater than 45 degrees, preferably between 80–90 degrees, the angle $\theta_4$ is sufficiently large enough to ensure the angles ($\alpha$) of incidence of colliding materials are generally sufficiently large for better adhesion to the sidewall. Referring to FIG. 6D, a target sidewall 620 includes a lip 622 that has an upper edge 624 that has a positive slope 626, where the upper edge 624 has an angle β that is no more than about 60 degrees, preferably 15 degrees or less.

Figure 8:
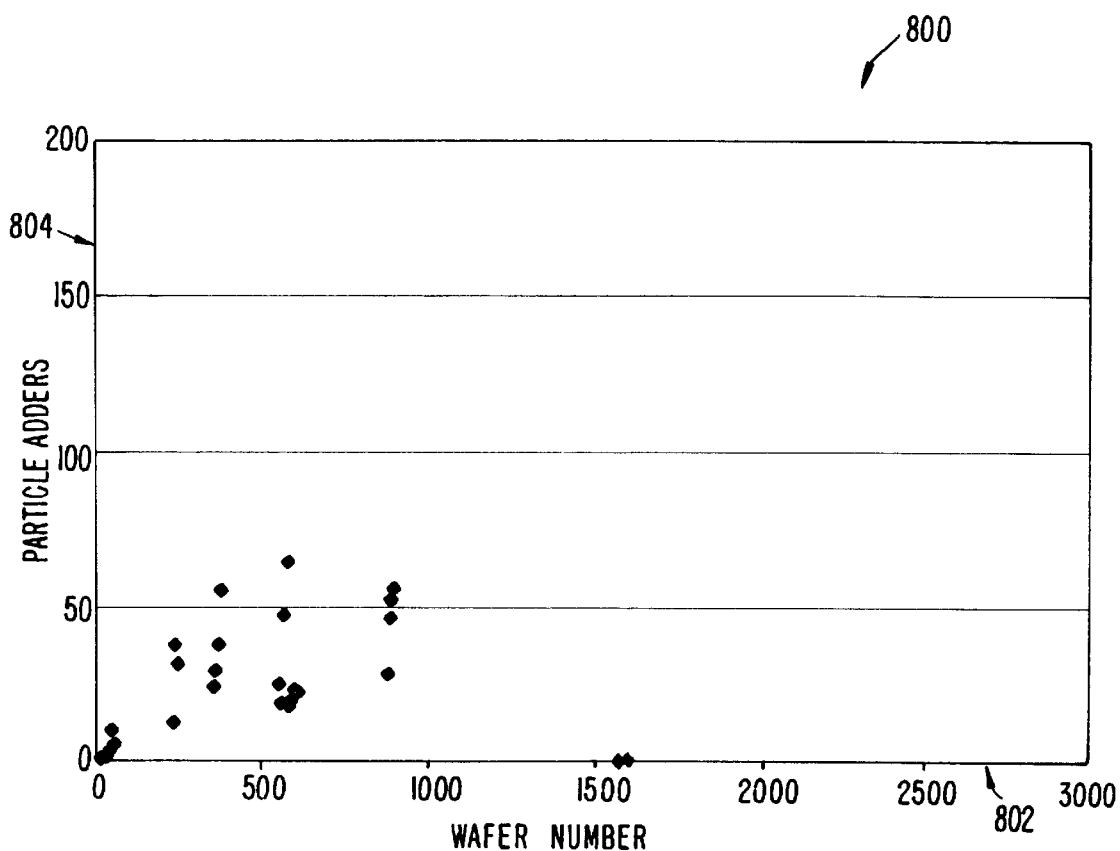
FIG. 8 shows the results of a particle adder experiment performed using a conventional target.
Figure 9:
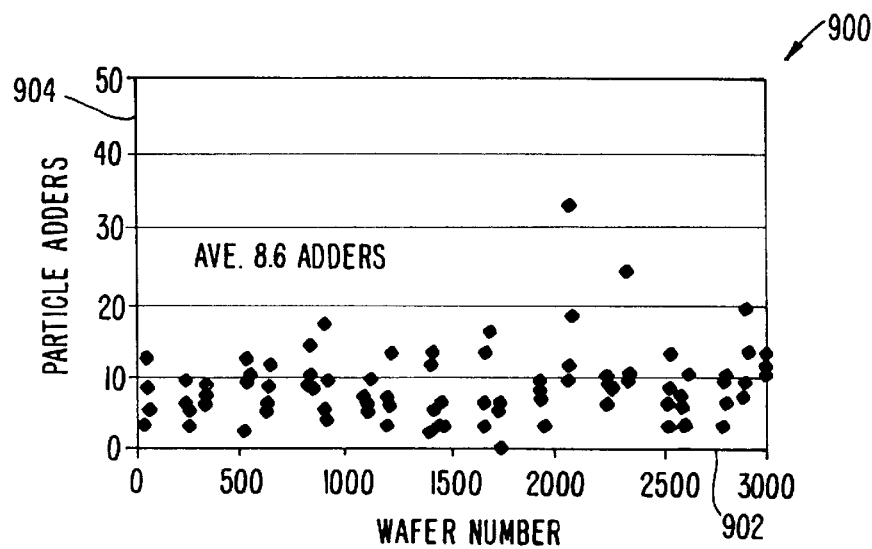
FIG. 9 shows the results of a particle adder experiment performed using a sputtering target having a lip on the sidewall according to one embodiment of the present invention.

FIGS. 8–9 illustrate that the target sidewall 208 having the lip 402 provides considerably better particle control over the conventional target sidewall. FIG. 8 shows a table 800 which provides the results of a particle-adder experiment conducted using a conventional target having a smooth sidewall. An SIP TTN™ sputtering chamber, configured for eight inch wafers, was used for the experiment. The x-axis 802 of the table provides the number of wafers processed, and the y-axis 804 provides the number of particle adders found after a particular number of wafers have been processed. Only particles greater than 0.2 μm were counted. The following sequence of processes were performed for each wafer: (1) Ti deposition of about 320 Å, (2) TiN deposition of about 480 Å, and (3) shutter paste. The process parameters for the Ti deposition step are as follows: 18 kWatt to the target, chamber pressure of 0.7 mTorr, 400 Watt of bias power, and 16 seconds. The process parameters for the TiN deposition step are as follows: 18 kWatt to the target, chamber pressure of 3.6 mTorr, 200 Watt of bias power, and 52 seconds. The process parameters for the shutter paste are as follows: 18 kWatt to the target, chamber pressure of 0.7 mTorr, 0 bias power, and 60 seconds.

FIG. 9 shows a table 900 which provides the results of a particle-adder experiment conducted using the target 208 having the lip 402. The x-axis 902 of the table provides the number of wafers processed, and the y-axis 904 provides the number of particle adders found after a particular number of wafers have been processed. Only particles greater than 0.2 μm were counted. The process sequence and parameters of this experiment were kept the same as the experiment in FIG. 8.

Referring back to FIGS. 8 and 9, the table 800 shows that the particle adder count increased to over 50 after several hundred process runs for the conventional target. In comparison, the table 900 shows that the wafers processed with the target 208 according to one embodiment of the present invention only generated an average of 8.6 particle adders after 3000 process runs, a substantial improvement over the conventional method.

While the foregoing is directed to the preferred embodiment of the present invention, other and further embodiments of the invention may be devised without departing from the basic scope thereof. The scope of the invention is determined by the claims which follow.

What is claimed is:

1. An apparatus for a physical vapor deposition system, comprising:
a target having a sidewall having an undercut thereon defining a net erosion area and a net redeposition area.

2. The apparatus of claim 1, wherein the undercut defines a lip having a lower portion defining the net erosion area, an upper portion defining the net redeposition area, and a tip therebetween, wherein the net redeposition area is provided on or above the upper portion.

3. The apparatus of claim 2, wherein the target sidewall further comprises:
a vertical edge having a first portion and a second portion, wherein the first portion is connected to the upper portion of the lip; and
an outer surface joined to the second portion of the vertical edge; and
a lower surface provided below the lip.

4. The apparatus of claim 3, wherein the lip has a horizontal extension of about 0.01 to 0.20 inch.

5. The apparatus of claim 4, wherein the horizontal extension is a horizontal distance from the vertical edge to the tip of the lip.

6. The apparatus of claim 3, wherein the lip has a vertical extension of about 0.05 to 0.3 inch.

7. The apparatus of claim 4, wherein the vertical extension is a vertical distance from the lower surface to the tip of the lip.

8. The apparatus of claim 1, wherein the undercut is made at or within 0.1 inch of a previously determined transition point.

9. The apparatus of claim 8, wherein the undercut is made at or within 0.005 inch below the previously determined transition point.

10. The apparatus of claim 9, wherein the undercut is made at the previously determined transition point.

11. The apparatus of claim 9, wherein the transition point is experimentally determined.

12. An apparatus for a physical vapor deposition system, comprising:
a target having a sidewall having an undercut defining a net erosion area and a net redeposition area, wherein the undercut defines a lip having a lower portion defining the net erosion area, an upper portion defining the net redeposition area, and a tip therebetween, the lip having a horizontal extension of about 0.01 to 0.05 inch, the undercut being made within 0.002 inch of a previously determined transition point.

13. A target for a physical vapor deposition system, comprising:
a lower surface; and
a sidewall defined around the lower surface, the sidewall including an undercut defining a net erosion area and a net redeposition area.

14. The target of claim 13, wherein the undercut defines a protrusion having a first portion, a second portion, and a third portion therebetween, the radius of curvature of the third portion is less than about 0.05 inch.

15. The target of claim 14, wherein the third portion is provided within about 0.01 inch of a transition point between net erosion and redeposition areas.

16. The target of claim 15, wherein the transition point is experimentally determined.

17. The target of claim 14, wherein the sidewall further includes a vertical edge extending upwardly from the second portion at an angle greater about 80 degrees.

18. The target of claim 14, wherein the sidewall further includes a vertical edge extending upwardly from the second portion at an angle greater about 45 degrees.

19. A sputtering target having a visible feature defining a net erosion area and a net redeposition area prior to having been exposed to a sputtering process.

20. A method for manufacturing a target, the method comprising:
determining a transition point on a sidewall of a first target, the transition point defining a net erosion area and a net redeposition area; and
providing an undercut on a sidewall of a second target according to the transition point determined.

21. An apparatus for a physical vapor deposition system, comprising:
a target having a sidewall, the sidewall having a lip, the lip having a lower portion defining a net erosion area, an upper portion defining a net redeposition area, and a tip therebetween, wherein the lip has a vertical extension of about 0.05 to about 0.3 inch, the vertical extension defining a distance from a lower surface of the lip to the tip of the lip.

* * * * *